US009917029B2

(12) United States Patent
Liu et al.

(10) Patent No.: US 9,917,029 B2
(45) Date of Patent: Mar. 13, 2018

(54) HEAT DISSIPATER FOR MAIN HEAT GENERATING DEVICE WITH PERIPHERAL HEAT GENERATING DEVICES

(71) Applicant: Huawei Technologies Co., Ltd., Shenzhen (CN)

(72) Inventors: Zhenzhen Liu, Beijing (CN); Xiaojing Hou, Beijing (CN); Shanjiu Chi, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 239 days.

(21) Appl. No.: 14/081,288

(22) Filed: Nov. 15, 2013

(65) Prior Publication Data

US 2014/0069611 A1  Mar. 13, 2014

Related U.S. Application Data

(63) Continuation of application No. PCT/CN2011/080424, filed on Sep. 30, 2011.

(51) Int. Cl.
*F28F 7/00* (2006.01)
*H01L 23/367* (2006.01)
(Continued)

(52) U.S. Cl.
CPC .......... *H01L 23/3672* (2013.01); *H01L 23/36* (2013.01); *H01L 23/40* (2013.01);
(Continued)

(58) Field of Classification Search
CPC . H01L 23/3672; H01L 23/40; H01L 23/4006; H01L 23/427; F28D 15/0266;
(Continued)

(56) References Cited

U.S. PATENT DOCUMENTS 5,053,856 A  10/1991  Davidson
6,252,774 B1 *  6/2001  Rife ................... H01L 23/3675
257/727
(Continued)

FOREIGN PATENT DOCUMENTS

CN  2692834 Y  4/2005
CN  1618127 A  5/2005
(Continued)

OTHER PUBLICATIONS

Foreign Communication From a Counterpart Application, Chinese PCT Application No. PCT/CN2011/080424, Chinese Search Report dated Jun. 28, 2012, 7 pages.
(Continued)

*Primary Examiner* — Jianying Atkisson
*Assistant Examiner* — Jose O Class-Quinones
(74) *Attorney, Agent, or Firm* — Conley Rose, P.C.

(57)  ABSTRACT

Embodiments of the present invention provide a heat dissipater and relate to the communications field. The heat dissipater includes a sub heat dissipater, a connecting apparatus, and a shared bracket; the sub heat dissipater is connected to the shared bracket through the connecting apparatus; the sub heat dissipater includes a first heat conducting surface, and the sub heat dissipater contacts a first heat source through the first heat conducting surface to dissipate heat for the first heat source; the shared bracket includes a second heat conducting surface, and the shared bracket contacts a second heat source through the second heat conducting surface to dissipate heat for the second heat source; and the second heat conducting surface and the sub heat dissipater are disposed in different positions of the shared bracket respectively.

11 Claims, 4 Drawing Sheets

(51) Int. Cl.
  *H01L 23/36* (2006.01)
  *H01L 23/40* (2006.01)
  *H01L 23/427* (2006.01)

(52) U.S. Cl.
  CPC ........ *H01L 23/4006* (2013.01); *H01L 23/427* (2013.01); *H01L 2924/0002* (2013.01)

(58) Field of Classification Search
  CPC ........... F28D 15/043; F28D 2021/0028; F28D 2021/0029
  USPC ......... 165/104.26, 185, 80.3, 104.21, 104.33
  See application file for complete search history.

(56) References Cited

U.S. PATENT DOCUMENTS

| | | | |
|---|---|---|---|
| 6,545,879 | B1 | 4/2003 | Goodwin |
| 6,661,661 | B2 | 12/2003 | Gaynes et al. |
| 7,443,680 | B1 * | 10/2008 | Peng ........................ G06F 1/20 |
| | | | 165/104.33 |
| 7,990,719 | B2 * | 8/2011 | Chen ................. H05K 7/20154 |
| | | | 165/185 |
| 2005/0167083 | A1 * | 8/2005 | Belady .................... H01L 23/34 |
| | | | 165/80.3 |
| 2007/0115643 | A1 * | 5/2007 | Chen .................. H01L 23/4006 |
| | | | 361/719 |
| 2007/0263357 | A1 * | 11/2007 | Ju ........................ H01L 23/427 |
| | | | 361/702 |
| 2008/0050196 | A1 * | 2/2008 | Cao ........................ F16B 5/065 |
| | | | 411/107 |
| 2009/0050309 | A1 | 2/2009 | Yu et al. |
| 2009/0059538 | A1 * | 3/2009 | Peng ........................ G06F 1/20 |
| | | | 361/719 |
| 2009/0266513 | A1 * | 10/2009 | Xiong ................... H01L 23/427 |
| | | | 165/80.3 |
| 2009/0310296 | A1 * | 12/2009 | Peng ........................ G06F 1/20 |
| | | | 361/679.49 |
| 2010/0165566 | A1 * | 7/2010 | Li ............................. G06F 1/20 |
| | | | 361/679.47 |
| 2010/0212869 | A1 * | 8/2010 | Liu ....................... H01L 23/367 |
| | | | 165/104.26 |
| 2010/0271774 | A1 * | 10/2010 | Peng ..................... H01L 23/427 |
| | | | 361/679.52 |

FOREIGN PATENT DOCUMENTS

| | | |
|---|---|---|
| CN | 2729902 Y | 9/2005 |
| CN | 101150101 A | 3/2008 |
| CN | 101374401 A | 2/2009 |
| CN | 101431878 A | 5/2009 |
| CN | 102449759 A | 5/2012 |

OTHER PUBLICATIONS

Foreign Communication From a Counterpart Application, Chinese PCT Application No. PCT/CN2011/080424, Chinese Written Opinion dated Jun. 28, 2012, 6 pages.
Foreign Communication From a Counterpart Application, Chinese Application No. 201180001950.0, Chinese Office Action dated Nov. 5, 2012, 8 pages.

* cited by examiner

HEAT DISSIPATER FOR MAIN HEAT GENERATING DEVICE WITH PERIPHERAL HEAT GENERATING DEVICES

CROSS-REFERENCE TO RELATED APPLICATION

This application is a continuation of International Application No. PCT/CN2011/080424, filed on Sep. 30, 2011, which is hereby incorporated by reference in its entirety.

STATEMENT REGARDING FEDERALLY SPONSORED RESEARCH OR DEVELOPMENT

Not applicable.

REFERENCE TO A MICROFICHE APPENDIX

Not applicable.

TECHNICAL FIELD

The present invention relates to the field of electronic products, and in particular, to a heat dissipater.

BACKGROUND

Boards are widely used in the field of electronic products. Generally, one or more master chips are disposed on a board, and multiple peripheral devices are disposed around each master chip on the board. Because of a feature that the peripheral devices are contiguous to the master chip, it is not practicable to add independent heat dissipaters to dissipate heat for the master chip and the peripheral devices respectively. Therefore, a shared heat dissipater solution needs to be adopted to dissipate heat for the master chip and the peripheral devices.

Currently, an existing shared heat dissipater includes a substrate and a heatsink. The substrate is disposed above all master chips and all peripheral devices; a thermal pad is stuffed between the substrate and the master chips, and between the substrate and the peripheral devices respectively to eliminate a height difference between the master chips and the peripheral devices, thereby ensuring that the master chips and the peripheral devices dissipate heat through the shared heat dissipater. Meanwhile, the shared heat dissipater is fixed to the board through a screw.

In a process of implementing the present invention, the inventor finds that the prior art has at least the following problems:

On the one hand, the thermal pad itself is an elastomer having a thickness specification and a compression amount requirement. Therefore, during installation, the thermal pad needs to be compressed by screwing the shared heat dissipater to the board by using a mounting screw, which causes that the shared heat dissipater receives a high pressure stress. The pressure stress is imposed on the master chips and the peripheral devices through the thermal pad, which causes reliability of the master chips and the peripheral devices to deteriorate.

On the other hand, the thermal pad itself has a poor heat dissipation effect, and the master chips have a feature of high power consumption, which causes a junction temperature of the master chips to rise, thereby causing a poor heat dissipation effect of the shared heat dissipater.

SUMMARY

To overcome a problem of poor reliability of master chips and peripheral devices caused by an existing large stress on the master chips and the peripheral devices because a shared heat dissipater is adopted and a problem of a poor heat dissipation effect in the prior art, an embodiment of the present invention provides a heat dissipater. A technical solution is as follows:

A heat dissipater includes a sub heat dissipater, a connecting apparatus, and a shared bracket, where the sub heat dissipater is connected to the shared bracket through the connecting apparatus; the sub heat dissipater includes a first heat conducting surface, and the sub heat dissipater contacts a first heat source through the first heat conducting surface to dissipate heat for the first heat source; the shared bracket includes a second heat conducting surface, and the shared bracket contacts a second heat source through the second heat conducting surface to dissipate heat for the second heat source; and the second heat conducting surface and the sub heat dissipater are disposed in different positions of the shared bracket respectively.

Beneficial effects of the technical solution of the present invention are as follows:

Compared with the prior art, the heat dissipater in the embodiment of the present invention implements heat dissipation of a second heat source by using a second heat conducting surface of a shared bracket, implements heat dissipation of a first heat source by using a first heat conducting surface of a sub heat dissipater, and implements installation of the first heat source and the second heat source on a same surface by using a connecting apparatus; only a very small force is needed to implement good contact between the first heat source and the sub heat dissipater. On the one hand, a stress on the first heat source is reduced, and reliability of the first heat source is increased; on the other hand, an impact caused by a thermal pad on heat dissipation of the first heat source and the second heat source in the prior art is eliminated, and an overall heat dissipation effect is improved.

Figure 1:
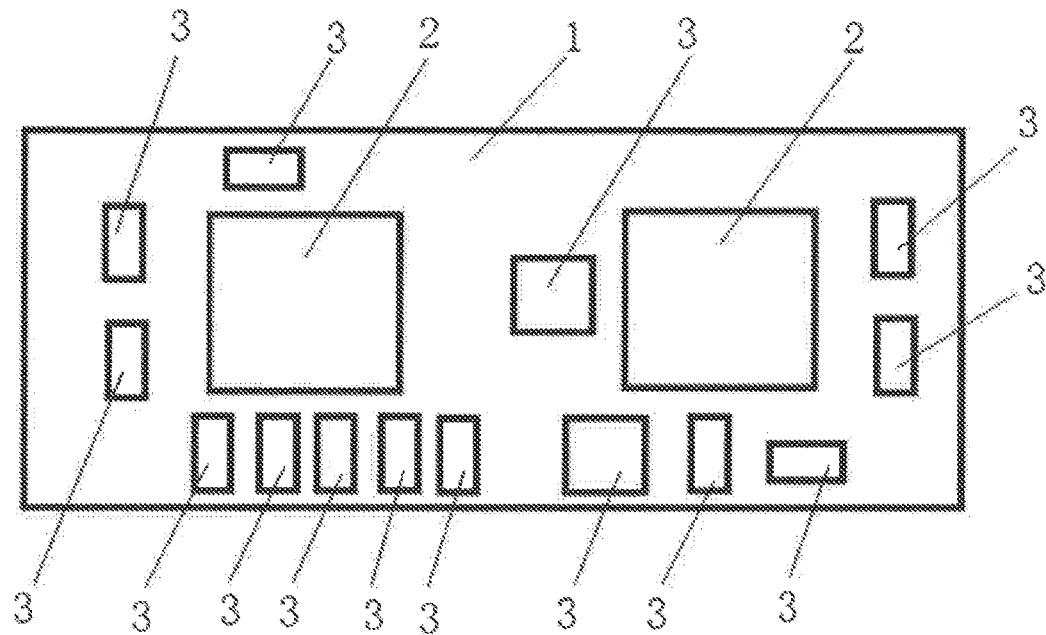
FIG. 1 is a layout view of a board according to an embodiment of the present invention.

Components represented by reference numerals in the drawings are listed as follows:

1—board;
2—master chip, 21—master chip A, 22—master chip B;
3—peripheral device, 31—peripheral device A, 32—peripheral device B;

4—sub heat dissipater, 4A—first heat conducting surface, 41—sub heat dissipater A, 42—sub heat dissipater B;
5—substrate, 5A—embedding part, 5B—connecting part, 51—substrate of a sub heat dissipater A, 52—substrate of a sub heat dissipater B;
6—heatsink, 61—heatsink of a sub heat dissipater A, 62—heatsink of a sub heat dissipater B;
7—shared bracket, 7A—second heat conducting surface, 71—perforation;
8—connecting apparatus, 81—supporting rod, 81A—internal screw thread, 82—screw,
83—spring, 81A—smooth supporting rod, 811A—position limiting structure;
9—flexible heat conducting apparatus, 91—bridge heat pipe, 91A—deformation zone;
10—auxiliary heat conducting element, 10A—evaporation end of a heat pipe, 10B—condensation end of a heat pipe.

DETAILED DESCRIPTION

To make objectives, technical solutions and advantages of the present invention clearer, the following further describes embodiments of the present invention in detail with reference to the accompanying drawings.

In an embodiment of the present invention, a board, and master chips and peripheral devices on the board are taken as an example for description. In a board as shown in FIG. 1, multiple master chips 2 are disposed on a board 1, and multiple peripheral devices 3 are disposed around each master chip 2. Certainly, persons skilled in the art may understand that the master chips 2 and the peripheral devices 3 may be any heat emitting device. In this example, the master chips 2 are defined as first heat sources, and the peripheral devices 3 are defined as second heat sources.

Figure 2:
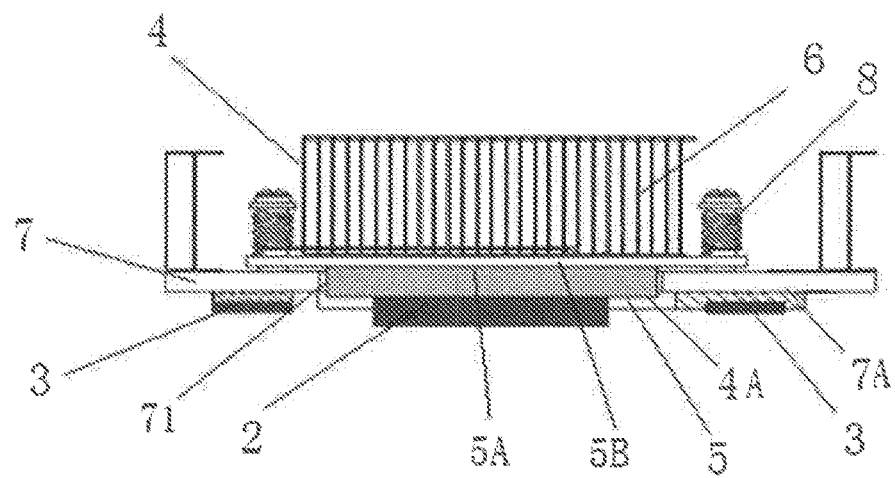
FIG. 2 is a schematic assembled view of a heat dissipater, a master chip, and peripheral devices according to an embodiment of the present invention.

As shown in FIG. 2, a heat dissipater provided in an embodiment of the present invention includes a sub heat dissipater 4, a connecting apparatus 8, and a shared bracket 7. The sub heat dissipater 4 is connected to the shared bracket 7 through the connecting apparatus 8. The sub heat dissipater 4 includes a first heat conducting surface 4A, and the sub heat dissipater 4 contacts a first heat source (referring to a master chip 2 in this example) through the first heat conducting surface 4A to dissipate heat for the first heat source (referring to the master chip 2 in this example); the shared bracket 7 includes a second heat conducting surface 7A, and the shared bracket 7 contacts a second heat source (referring to a peripheral device 3 in this example) through the second heat conducting surface 7A to dissipate heat for the second heat source (referring to the peripheral device 3 in this example); and the second heat conducting surface 7A and the sub heat dissipater 4 are disposed in different positions of the shared bracket 7 respectively.

In this example, the first heat source is the master chip 2, and the second heat source is the peripheral device 3.

Referring to FIG. 2, compared with the prior art, the heat dissipater in the embodiment of the present invention implements heat dissipation of the peripheral device 3 by using the shared bracket 7, implements heat dissipation of the master chip 2 by using the sub heat dissipater 4, and implements installation of the master chip 2 and the sub heat dissipater 4 on a same surface by using the connecting apparatus 8, which ensures good contact between the master chip 2 and the sub heat dissipater 4. The structure provided in the embodiment of the present invention ensures good contact between the peripheral device 3 and the shared bracket 7 without the need of applying a thick thermal pad, which avoids a problem that a junction temperature rises because the thick thermal pad is stuffed to eliminate a height difference in the prior art, eliminates temperature rise caused by the thermal pad to a master chip with high power consumption, and improves an overall heat dissipation effect of the heat dissipater.

Specifically, the connecting apparatus may be a shared fixing and connecting apparatus, such as screw connection, bolt and nut connection, or rivet connection.

Specifically, as shown in FIG. 2, the sub heat dissipater 4 in this embodiment includes a substrate 5 and a heatsink 6. The first heat conducting surface 4A of the sub heat dissipater 4 and the heatsink 6 are formed at two opposite sides of the substrate 5 respectively.

Preferably, in this embodiment, as shown in FIG. 2, the substrate 5 of the sub heat dissipater 4 specifically includes a connecting part 5B and an embedding part 5A. The connecting part 5B is connected to the shared bracket 7, the heatsink 6 of the sub heat dissipater 4 is formed on an upper surface of the connecting part 5B, the embedding part 5A is formed on a lower surface of the connecting part 5B relative to the heatsink 6, and the first heat conducting surface 4A is formed on a lower surface of the embedding part 5A; corresponding to the embedding part 5A of the substrate 5, a perforation 71 is formed on the shared bracket 7, and the embedding part 5A of the substrate 5 is disposed in the perforation 71 of the shared bracket 7.

To better solve a problem of the height difference between the first heat source and the second heat source and implement installation of the first heat source and the second heat source on the same surface, specifically, as shown in FIG. 2, the connecting apparatus 8 may float relative to the shared bracket 7 to adjust an installation distance between the first heat source, namely the master chip 2, and the second heat source, namely the peripheral device 3, thereby implementing installation of the first heat source, namely the master chip 2, and the second heat source, namely the peripheral device 3, on the same surface. Installation on the same surface means that a bottom surface of the master chip 2 is flush with a bottom surface of the peripheral device 3.

In this embodiment, the sub heat dissipater 4 floats relative to the shared bracket 7 through its connecting apparatus 8, so as to adjust the installation distance between the master chip 2 and the peripheral device 3. It is verified that after the connecting apparatus 8 provided in the present invention is applied on a board, compared with the prior art, a pressure that the master chip 2 endures can be effectively reduced by two-thirds, and therefore, reliability of the master chip 2 is greatly improved.

Figure 3:
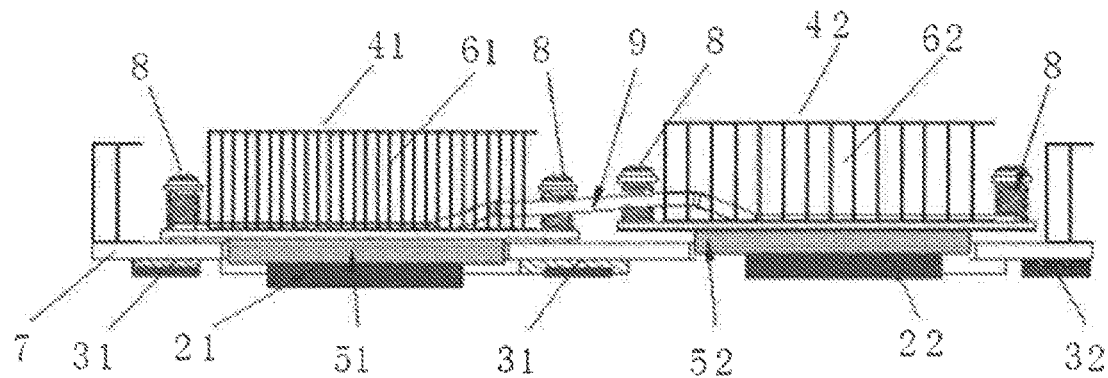
FIG. 3 is a schematic assembled view of a heat dissipater, master chips, and peripheral devices according to another embodiment of the present invention.
Figure 4:
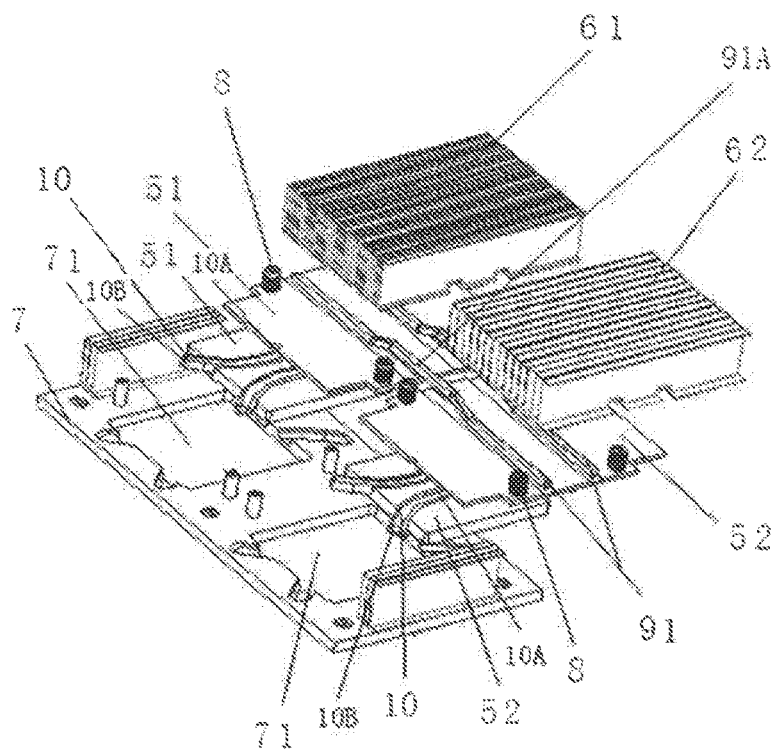
FIG. 4 is an exploded view of parts of the heat dissipater from which the peripheral devices are removed according to the another embodiment of the present invention in FIG. 3.

Specifically, FIG. 3 shows a heat dissipater in another embodiment of the present invention. Reference may also be made to FIG. 4. This embodiment is described primarily with reference to FIG. 3, and two first heat sources, namely two master chips, are taken as an example for description in this embodiment. Specifically, the two master chips include a master chip A 21 and a master chip B 22. Peripheral devices 3 include a peripheral device A 31 corresponding to the master chip A 21, and a peripheral device B 32 corresponding to the master chip B 22. The heat dissipater includes a shared bracket 7, a sub heat dissipater A 41, a sub heat dissipater B 42, and two connecting apparatuses 8. The sub heat dissipater A 41 includes a substrate 51 of the sub heat dissipater A and a heatsink 61 of the sub heat dissipater A, and the sub heat dissipater B 42 includes a substrate 52 of the sub heat dissipater B and a heatsink 62 of the sub heat dissipater B. Two perforations 71 are disposed on the shared bracket 7. Part of the master chip A 21 and an embedding part of the substrate 51 of the sub heat dissipater A are embedded into one perforation 71, and part of the master chip B 22 and an embedding part of the substrate 52 of the sub heat dissipater B are embedded into the other perforation 71. The peripheral device A 31 and the peripheral device B 32 are connected below the shared bracket 7, and dissipate heat through the shared bracket 7. One of the two connecting apparatuses 8 is disposed between the shared bracket 7 and the substrate 51 of the sub heat dissipater A, and the other connecting apparatus 8 is disposed between the shared bracket 7 and the substrate 52 of the sub heat dissipater B.

In this embodiment, the sub heat dissipater A 41 and the sub heat dissipater B 42 share one shared bracket 7, which effectively reduces screw mounting holes of the heat dissipater and improves installation efficiency.

Figure 5:
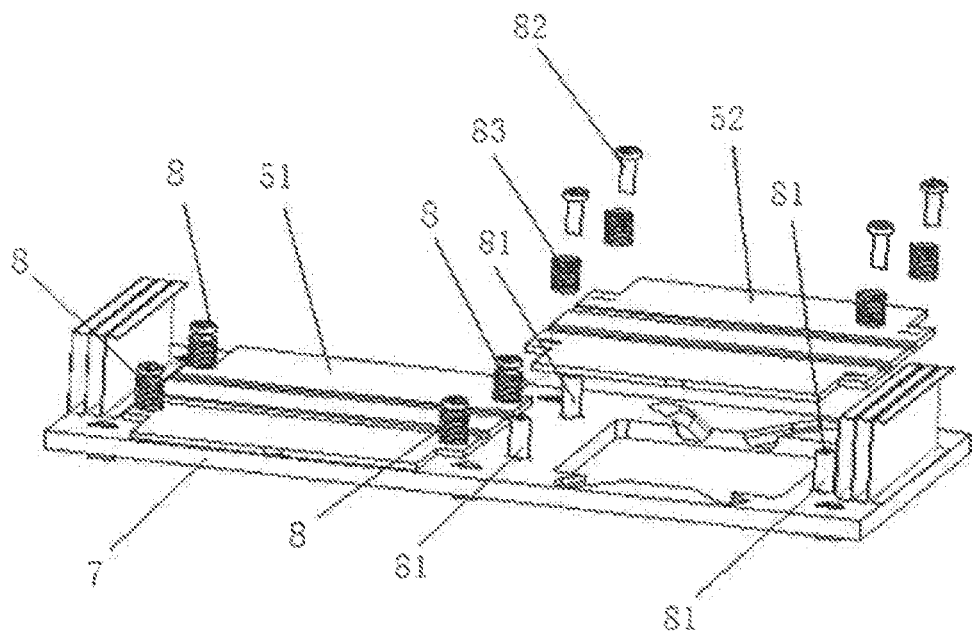
FIG. 5 is a schematic structural view of a connecting apparatus according to an embodiment of the present invention.

Preferably, as shown in FIG. 5, in this embodiment, two master chips are specifically taken as an example for description. The two connecting apparatuses 8 are of a same structure. In this example, the connecting apparatus 8 disposed in the sub heat dissipater B 42 (refer to FIG. 3) is taken as an example for description. Referring to FIG. 5, the connecting apparatus 8 includes at least two pairs of one-to-one matching supporting rods 81, screws 82, and springs 83. At least two supporting rods 81 are distributed on the shared bracket 7, and at least two screws 82 penetrate a connecting part of the substrate 52 of the sub heat dissipater B 42 (refer to FIG. 3) respectively, and are fixed to the shared bracket 7. Positions of the at least two screws 82 correspond to positions of the at least two supporting rods 81, and the at least two supporting rods 81 are sheathed in at least two springs 83 correspondingly. Internal screw threads 81A are provided on the supporting rods 81, external screw threads are provided on the screws 82, and the internal screw threads 81A of the supporting rods 81 match the external screw threads of the screws 82.

FIG. 5 shows the connecting apparatus 8 in the embodiment of the present invention. In this example, a structure of the connecting apparatus 8 of the sub heat dissipater A 41 is the same as a structure of the connecting apparatus 8 of the sub heat dissipater B 42. The connecting apparatuses 8 each include four supporting rods 81, four screws 82, and four springs 83. Certainly, persons skilled in the art may understand that the number of the supporting rods 81, the number of the screws 82, and the number of the springs 83 are set properly according to the area of a substrate of a sub heat dissipater, for example, 2, 3, 5, and 6.

Figure 5A:
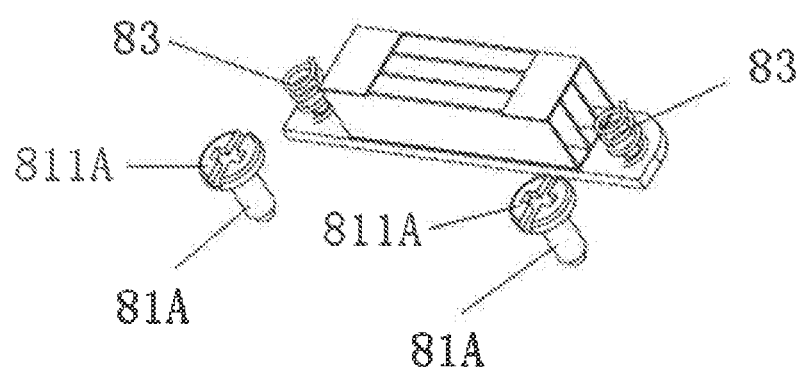
FIG. 5A is a schematic structural view of a connecting apparatus according to another embodiment of the present invention.

Certainly, persons skilled in the art may understand that the connecting apparatus is not limited to a structure form of supporting rods with internal screw threads and screws with external screw threads; and the supporting rods and the screws may also be designed as an integrated structure, that is, a smooth supporting rod with a top position limiting structure (refer to FIG. 5A).

Specifically, FIG. 5A shows a connecting apparatus. In this example, the connecting apparatus includes at least two pairs of one-to-one matching smooth supporting rods 81A and springs 83. Bottoms of at least two smooth supporting rods 81A penetrate connecting parts of their respective substrates respectively, and are fixed to the shared bracket (not shown in the figure). The at least two smooth supporting rods 81A are sheathed in at least two springs 83 correspondingly, and position limiting structures 811A are disposed on tops of the at least two smooth supporting rods 81A.

Further, as shown in FIG. 4, in this embodiment, the heat dissipater further includes an auxiliary heat conducting element 10. In this example, the connecting apparatus 8 disposed in the sub heat dissipater A 41 (refer to FIG. 3) is taken as an example for description, and the auxiliary heat conducting element 10 is thermally conductively connected to the sub heat dissipater A 41 (refer to FIG. 3) and the shared bracket 7, and is used to implement heat transfer between the sub heat dissipater A 41 (refer to FIG. 3) and the shared bracket 7.

Specifically, as shown in FIG. 4, in this example, the shared bracket 7 is linked to the sub heat dissipater A 41 (refer to FIG. 3) through its auxiliary heat conducting element 10, and the shared bracket 7 is linked to the sub heat dissipater B 42 (refer to FIG. 3) through its auxiliary heat conducting element 10, where the auxiliary heat conducting elements 10 are heat pipes.

Certainly, persons skilled in the art may understand that the auxiliary heat conducting elements are not limited to heat pipes, and may also be materials having a high thermal conductivity, such as VC.

Specifically, referring to FIG. 4, taking the auxiliary heat conducting element 10 of the heat dissipater A as an example for description, an evaporation end 10A of the auxiliary heat conducting element 10, namely the heat pipe, extends into the sub heat dissipater A, and a condensation end 10B of the heat pipe is connected to the shared bracket 7. Heat transfer between the sub heat dissipater A 41, the sub heat dissipater B 42, and the shared bracket 7 is implemented through temperature evenness performance of the heat pipe.

Referring to FIG. 3, on the basis that the connecting apparatus 8 is disposed, the heat dissipater in this embodiment implements heat conduction between the master chip A 21 and the peripheral device A 31 and heat conduction between the master chip B 22 and the peripheral device B 32, thereby solving a problem in the prior art that the peripheral device accumulates too much heat, but the sub heat dissipater of the master chip is not fully utilized, and heat dissipation waste is obvious because a heat dissipation area of the peripheral device cannot meet its own heat dissipation requirement and the size of a board is too small to enlarge the heat dissipation area of the peripheral device. The auxiliary heat conducting element 10 (refer to FIG. 4) solves a heat dissipation contradiction between the two, and implements heat dissipation optimization.

Further, as shown in FIG. 4, a bent section is disposed at the condensation end 10B of the auxiliary heat conducting element 10, namely the heat pipe, and the bent section is used to increase a flexible length of the heat pipe, thereby better ensuring relative floating between the substrate of the heat dissipater A, the substrate of the heat dissipater B, and the shared bracket 7, so as to absorb a greater height difference. In this example, the bent section is in an "L" shape. Certainly, persons skilled in the art may understand that the bent section is not limited to an "L" shape, and may also be in another bent form, such as a "U" shape, as long as the bent form can increase the flexible length of the auxiliary heat conducting element 10. Preferably, in this embodiment, two auxiliary heat conducting elements 10 are splayed.

Further, referring to FIG. 3, the heat dissipater includes at least two sub heat dissipaters and at least two connecting apparatuses 8 that correspond to the at least two sub heat dissipaters in a one-to-one manner. The at least two sub heat dissipaters 4 (refer to FIG. 2) are disposed on the shared bracket 7 through the at least two connecting apparatuses 8. The heat dissipater further includes at least one flexible heat conducting apparatus 9. The at least one flexible heat conducting apparatus 9 is connected to any two sub heat dissipaters 4 (refer to FIG. 2) in the at least two sub heat dissipaters 4 (refer to FIG. 2) respectively, so as to enable the any two sub heat dissipaters 4 (refer to FIG. 2) to implement heat exchange.

As shown in FIG. 3, in this embodiment, the heat dissipater includes the sub heat dissipater A 41, the sub heat dissipater B 42, and the connecting apparatuses 8 that correspond to them in a one-to-one manner. The flexible heat conducting apparatus 9 is disposed between the sub heat dissipater A 41 and the sub heat dissipater B 42. On the basis of floating and temperature evenness of a single master chip A 21 or master chip B 22, the flexible heat conducting apparatus 9 enables heat conduction between the sub heat dissipater A 41 and the sub heat dissipater B 42, ensures that a temperature of the sub heat dissipater A 41 and a temperature of the sub heat dissipater B 42 tend to be consistent, implements balance of a temperature field, and makes effective use of a heat dissipation area between the two master chips, thereby solving a problem in the prior art that when two master chips are disposed with independent heat dissipaters, and in a scenario where there is a big difference of power consumption or heat dissipation conditions between the two, a device with a bad heat dissipation condition needs a heat dissipater with a larger area to ensure heat dissipation while a device with a good heat dissipation condition has a large surplus and cannot reduce a heat dissipation area through thermal balance.

Specifically, referring to FIG. 4, the flexible heat conducting apparatus 9 is a bridge heat pipe 91.

Certainly, persons skilled in the art may understand that the auxiliary heat conducting element is not limited to a bridge heat pipe, and may also be any material having a high thermal conductivity.

Specifically, referring to FIG. 4, ends of the bridge heat pipe 91 are fixed to any two sub heat dissipaters respectively. In this embodiment, the ends of the bridge heat pipe 91 are fixed to the sub heat dissipater A 41 and the sub heat dissipater B 42 respectively.

More specifically, referring to FIG. 4, the master chip A 21 and the master chip B 22 are taken as examples for description here. One end of the bridge heat pipe 91 is fixed between the substrate 51 of the sub heat dissipater A and the heatsink 61 of the sub heat dissipater A, and the other end of the bridge heat pipe 91 is fixed between the substrate 52 of the sub heat dissipater B and the heatsink 62 of the sub heat dissipater B, which makes the structure design more reasonable.

Further, referring to FIG. 4, a deformation zone 91A is disposed in a local area or an entire area of the bridge heat pipe 91, and the deformation zone 91A is used to increase a flexible length of the bridge heat pipe 91.

More specifically, referring to FIG. 4, in this embodiment, a deformation zone 91A is disposed in a middle part of the bridge heat pipe 91. The deformation zone 91A is an arch. The arch design in a middle position of the bridge heat pipe 91 implements a flexible design solution of the bridge heat pipe 91 within a short distance.

Specifically, as shown in FIG. 4, the deformation zone 91A is a broken line arch.

Figure 6:
FIG. 6 is a brief structural view of a bridge heat pipe according to an embodiment of the present invention.

Specifically, as shown in FIG. 6, the deformation zone 91A is a curved arch.

Figure 7:
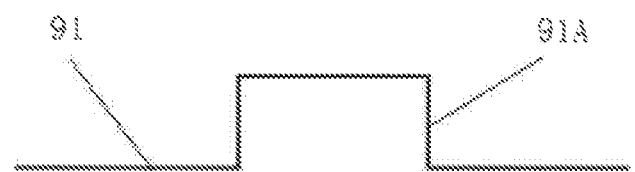
FIG. 7 is another brief structural view of a bridge heat pipe according to an embodiment of the present invention.

Specifically, as shown in FIG. 7, the deformation zone 91A is a rectangular arch.

Further, as shown in FIG. 4, the number of the bridge heat pipes 91 is 2. A redundant bridge heat pipe 91 is designed to ensure reliability of the bridge heat pipe 91. Meanwhile, the two bridge heat pipes 91 are evenly disposed at center positions of the sub heat dissipater A 41 and the sub heat dissipater B 42, so that damage to the bridge heat pipes 91 is avoided during an installation operation process.

It can be seen that, compared with the prior art, in the embodiments of the present invention, a heat dissipation balance is implemented between two master devices that differ sharply in power consumption, namely, a master chip and a device, a heat dissipation surplus of a master device having lower power consumption is used to solve a heat dissipation problem of a master device having higher power consumption, and the area of the heat dissipater is effectively reduced.

The foregoing description is merely exemplary embodiments of the present invention, but is not intended to limit the present invention. Any modification, equivalent substitution, and improvement made within the spirit and principle of the present invention shall fall within the protection scope of the present invention.

What is claimed is:

1. A heat dissipater, comprising:
   at least two sub heat dissipaters;
   a connecting apparatus;
   a shared bracket;
   at least two auxiliary heat conductive elements; and
   at least two flexible heat conductive apparatuses,
   wherein each of the at least two sub heat dissipaters is connected to the shared bracket through the connecting apparatus,
   wherein each of the at least two sub heat dissipaters comprises a first heat conducting surface,
   wherein each of the at least two sub heat dissipaters contacts a respective first heat source through each of the first heat conducting surfaces to dissipate heat from the first heat source,
   wherein the shared bracket comprises a second heat conducting surface,
   wherein the shared bracket contacts a second heat source through the second heat conducting surface to dissipate heat from the second heat source,
   wherein the second heat conducting surface and the at least two sub heat dissipaters are disposed in different positions of the shared bracket,
   wherein the at least two auxiliary heat conducting elements are respectively connected to the at least two sub heat dissipaters and the shared bracket, and implement heat transfer between the at least two sub heat dissipaters and the shared bracket,
   wherein each of the at least two auxiliary heat conducting elements comprises a heat pipe,
   wherein an evaporation end of each of the heat pipes extends into a respective sub heat dissipater,
   wherein a condensation end of each of the heat pipes is directly connected to the shared bracket such that the condensation end of each of the heat pipes contacts the shared bracket,
   wherein the at least two flexible heat conducting apparatuses comprise two arch-shaped bridge heat pipes that are connected between the at least two sub heat dissipaters to enable the at least two sub heat dissipaters to implement heat exchange with each other,
   wherein each of the at least two sub heat dissipaters comprises apertures through a fin area of the at least two sub heat dissipaters that form at least two open channels extending through an entire width of each of the at least two sub heat dissipaters, and
   wherein the two arch-shaped bridge heat pipes fit within and extend though the at least two open channels of each of the at least two sub heat dissipaters.

2. The heat dissipater according to claim 1, wherein each of the at least two sub heat dissipaters comprises a substrate and a heatsink, and wherein the first heat conducting surface of each of the at least two sub heat dissipaters and the heatsink are formed at two opposite sides of the substrate.

3. The heat dissipater according to claim 2, wherein the substrate of each of the at least two sub heat dissipaters comprises a connecting part and an embedding part, wherein the connecting part is connected to the shared bracket, wherein the heatsink of the heat dissipater is formed on an upper surface of the connecting part, wherein the embedding part is formed on a lower surface of the connecting part relative to the heatsink, wherein the first heat conducting surface is formed on a lower surface of the embedding part, wherein corresponding to the embedding part of the substrate, a perforation is formed on the shared bracket, and wherein the embedding part of the substrate is disposed in the perforation of the shared bracket.

4. The heat dissipater according to claim 3, wherein the connecting apparatus floats relative to the shared bracket to adjust an installation distance between the first heat source and the second heat source to implement installation of the first heat source and the second heat source on a same surface.

5. The heat dissipater according to claim 4, wherein the connecting apparatus comprises at least two pairs of one-to-one matching supporting rods, screws, and springs, wherein at least two supporting rods are distributed on the shared bracket, wherein at least two screws penetrate the substrate of each of the at least two sub heat dissipaters respectively and are fixed to the shared bracket, wherein positions of the at least two screws correspond to positions of the at least two supporting rods, wherein the at least two supporting rods are sheathed in at least two springs correspondingly, wherein internal screw threads are provided on the supporting rods, wherein external screw threads are provided on the screws, and wherein the internal screw threads of the supporting rods match the external screw threads of the screws.

6. The heat dissipater according to claim 1, wherein a bent section is disposed at the condensation end of the heat pipe, and wherein the bent section increases a flexible length of the heat pipe.

7. The heat dissipater according to claim 1, wherein a deformation zone is disposed in a local area of the at least two arch-shaped bridge heat pipes, and wherein the deformation zone increases a flexible length of the at least two arch-shaped bridge heat pipes.

8. The heat dissipater according to claim 1, wherein a deformation zone is disposed in an entire area of the at least two arch-shaped bridge heat pipes, and wherein the deformation zone increases a flexible length of the at least two arch-shaped bridge heat pipes.

9. The heat dissipater according to claim 1, wherein the auxiliary heat conducting element runs about orthogonal to the two arch-shaped bridge heat pipes.

10. A heat dissipater, comprising:
at least two sub heat dissipaters;
a connecting apparatus;
a shared bracket;
at least two auxiliary heat conductive elements; and
at least two flexible heat conductive apparatuses,
wherein each of the at least two sub heat dissipaters is connected to the shared bracket through the connecting apparatus,
wherein each of the at least two sub heat dissipaters comprises a first heat conducting surface,
wherein each of the at least two sub heat dissipaters contacts a respective first heat source through each of the first heat conducting surfaces to dissipate heat from the first heat source,
wherein the shared bracket comprises a second heat conducting surface,
wherein the shared bracket contacts a second heat source through the second heat conducting surface to dissipate heat from the second heat source,
wherein the second heat conducting surface and the at least two sub heat dissipaters are disposed in different positions of the shared bracket,
wherein each of the at least two auxiliary heat conducting elements comprises a heat pipe,
wherein an evaporation end of each of the heat pipes extends into a respective sub heat dissipater,
wherein a condensation end of each of the heat pipes is directly connected to the shared bracket such that the condensation end of each of the heat pipes contacts the shared bracket,
wherein a bent section is disposed at the condensation end of each of the heat pipes,
wherein the bent section of each of the heat pipes is used to increase a flexible length of the respective heat pipe,
wherein the at least two auxiliary heat conducting elements are respectively connected to the at least two sub heat dissipaters and the shared bracket, and implement heat transfer between the at least two sub heat dissipaters and the shared bracket,
wherein the at least two flexible heat conducting apparatuses comprise two arch-shaped bridge heat pipes that are connected between the at least two sub heat dissipaters to enable the at least two sub heat dissipaters to implement heat exchange with each other,
wherein each of the at least two sub heat dissipaters comprises apertures through a fin area of the at least two sub heat dissipaters that form at least two open channels extending through an entire width of each of the at least two sub heat dissipaters, and
wherein the two arch-shaped bridge heat pipes fit within and extend though the at least two open channels of each of the at least two sub heat dissipaters.

11. The heat dissipater according to claim 10, wherein the auxiliary heat conducting element runs about orthogonal to the two arch-shaped bridge heat pipes.

* * * * *